United States Patent [19]

Sayag

[11] Patent Number: 5,497,195
[45] Date of Patent: Mar. 5, 1996

[54] ELECTRONIC COLOR SNAPSHOT TECHNIQUE AND STRUCTURE USING VERY HIGH RESOLUTION MONOCHROME FULL FRAME CCD IMAGERS

[75] Inventor: Michel Sayag, Mt. View, Calif.

[73] Assignee: Loral Fairchild Corporation, Syosset, N.Y.

[21] Appl. No.: 325,959

[22] Filed: Oct. 20, 1994

Related U.S. Application Data

[63] Continuation of Ser. No. 994,875, Dec. 23, 1992, abandoned.

[51] Int. Cl.⁶ .................. H04N 9/07; H04N 9/04
[52] U.S. Cl. ............ 348/266; 348/269; 348/272; 348/311
[58] Field of Search .................. 348/268, 269, 348/272, 273, 280, 281, 282, 279, 277, 319, 242, 71, 311; 358/513, 524; H04N 9/07, 9/04

[56] References Cited

U.S. PATENT DOCUMENTS

| | | | |
|---|---|---|---|
| Re. 32,492 | 9/1987 | Takemura | 348/277 |
| 4,567,510 | 1/1986 | Tanaka et al. | 348/273 |
| 4,663,661 | 5/1987 | Weldy et al. | 348/242 |
| 4,989,075 | 1/1991 | Ito | 348/280 |
| 5,239,380 | 8/1993 | Yokoyama | 358/213.22 |
| 5,258,834 | 11/1993 | Tsuji et al. | 348/71 |
| 5,264,925 | 11/1993 | Shipp et al. | 358/41 |

*Primary Examiner*—Joseph Mancuso
*Assistant Examiner*—A. Christensen
*Attorney, Agent, or Firm*—Townsend and Townsend and Crew

[57] ABSTRACT

A technique and structure is used for producing high resolution color images using a monochrome area charge-coupled device (CCD) 64 and a sequential color illumination scheme. The monochrome CCD 64 comprises a plurality of semiconductor storage cells 76, the semiconductor storage cells 76 being configured in an array having vertical columns 74 and horizontal rows 79. The entire CCD 64 is exposed to a first color image. The charge packets 82 stored in two adjacent horizontal rows as a result of the exposure are then shifted into a third horizontal row. The CCD 64 is then exposed to a second color image. The charge packets 82 stored in the first horizontal row as a result of the second exposure are then shifted into the second horizontal row. The CCD 64 is then exposed to a third and final color image. The CCD output is digitized and stored in a frame. The color information of a particular location on the CCD array 64 is derived by utilizing a simple set of equations.

26 Claims, 10 Drawing Sheets

ELECTRONIC COLOR SNAPSHOT TECHNIQUE AND STRUCTURE USING VERY HIGH RESOLUTION MONOCHROME FULL FRAME CCD IMAGERS

This is a continuation of application Ser. No. 07/994,875, filed Dec. 23, 1992, now abandoned.

BACKGROUND OF THE INVENTION

This invention relates to a technique and structure for producing very high resolution color images using a monochrome charge-coupled device (CCD) imager and a sequential color illumination scheme.

Figure 1:
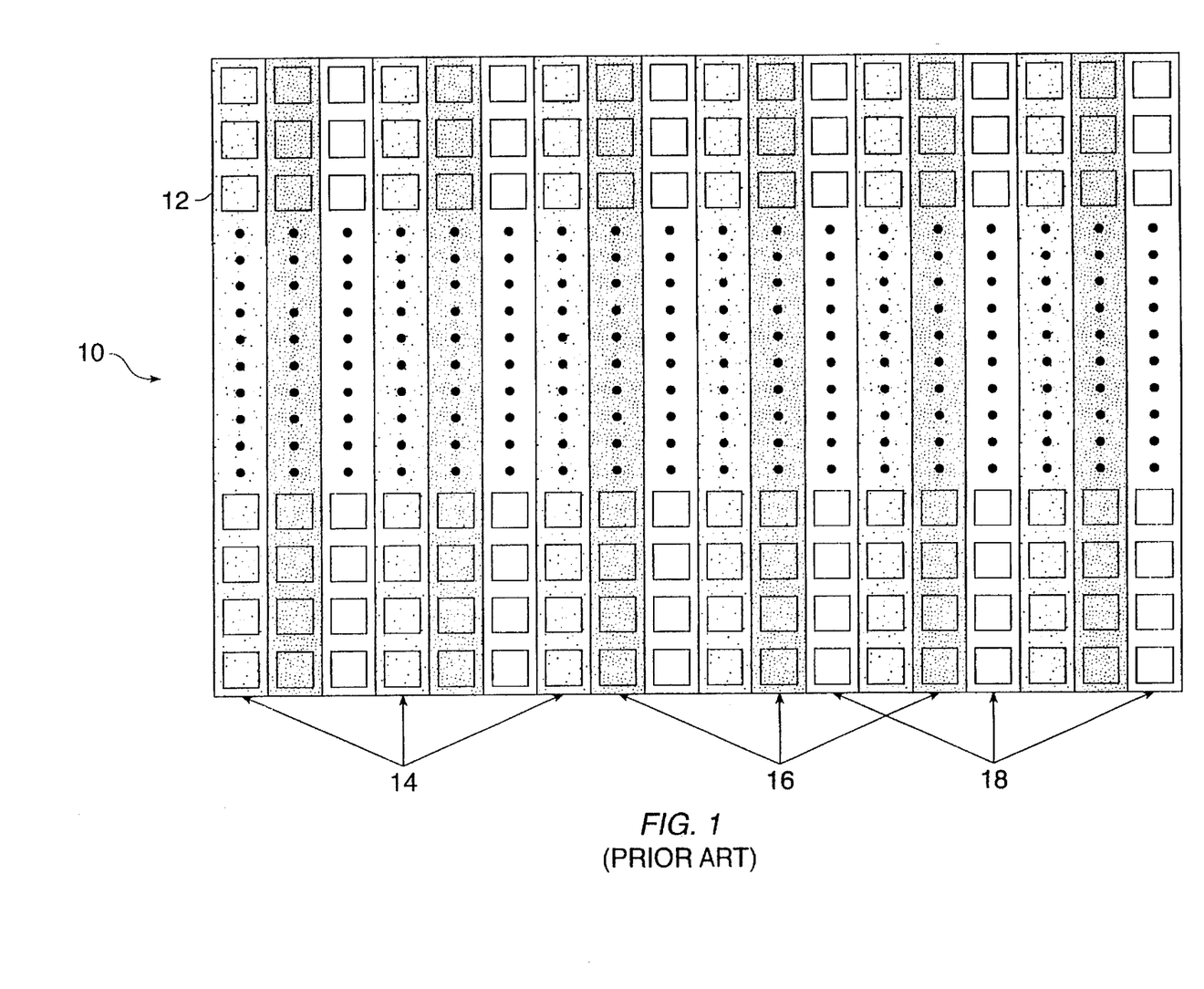
FIG. 1 is a simplified representation of a representative monolithic charge-coupled device color imager.

Conventional schemes for obtaining color electronic snapshots have traditionally employed one of three techniques. The first of these techniques uses white light illumination of a color CCD imager (FIG. 1). A color CCD imager 10 comprises a monochrome CCD imager upon which color sensitive stripes 14, 16, and 18 are deposited resulting in a mosaic of color pixels 12. The stripes are generally photo sensitive to alternating complementary colors such as red, green, and blue.

Figure 2:
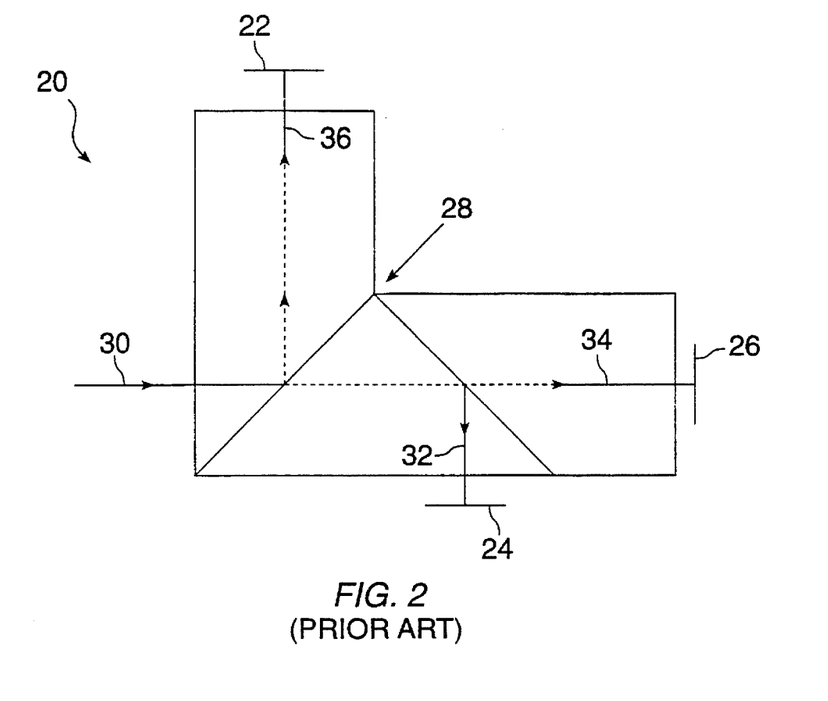
FIG. 2 is a simplified representation of a representative charge-coupled device color module.

The second technique uses white light illumination of a color CCD imaging module. As illustrated by FIG. 2, a color CCD imaging module 20 employs three monochrome CCD imagers 22, 24, and 26 placed behind a beam-splitter 28. The beam-splitter separates the incoming radiation 30 into three beams of different spectral bands (typically, red 32, green 34, and blue 36), with each imaging module storing one of the monochrome images. Both of these techniques can be used to obtain snapshots of subject matter with brief exposure time (e.g., moving objects), however the cost is considerable.

Figure 3:
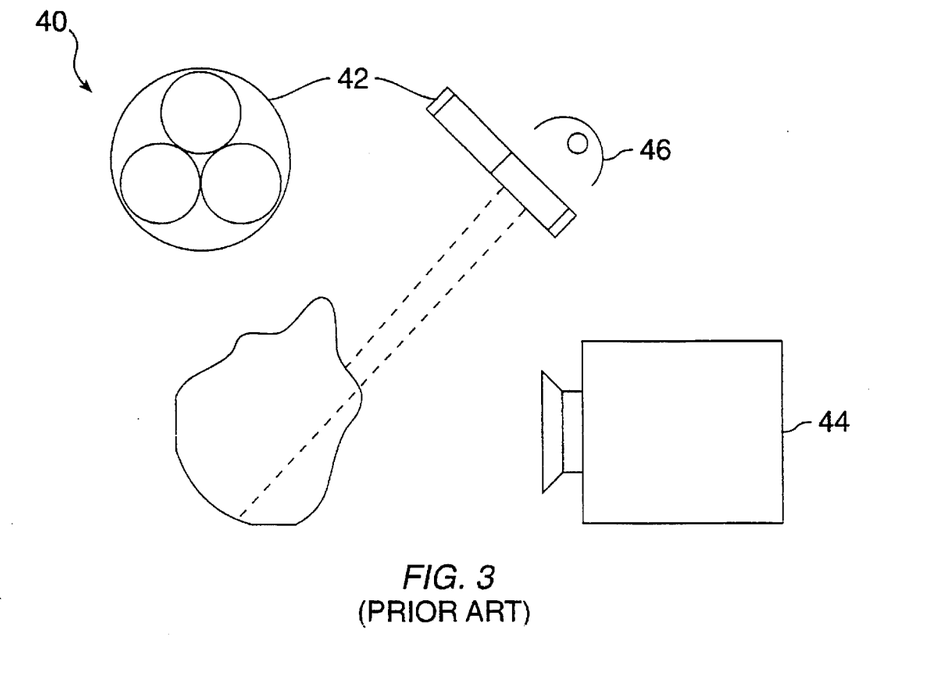
FIG. 3 is a simplified representation of a monochrome charge-coupled device imager camera system with a sequential color illumination scheme.

A third technique, as shown in FIG. 3, employs a system 40 which uses a monochrome CCD imager with a sequential color illumination scheme. A filter wheel 42 is rotated in front of the imager 44 or the light source 46 so that the imager is exposed to a series of the color images which are then read out sequentially. This technique is less expensive than the previously described techniques, but has limitations in the subject matter for which it can be used. Because the monochrome imager is generally exposed to three color images sequentially, the exposure time for obtaining a complete image is often longer than that required for the other techniques.

This problem is aggravated by the fact that the preferred CCD imager architecture for very high resolution color snapshots is the full frame architecture. The full frame architecture provides the highest pixel density but at the cost of maintaining a storage area. As a result of the fact that there is no storage area, image integration and readout times have to be successive rather than simultaneous as with other architectures used, for example, in video applications. Because of the need to shield the imager during successive image read-outs the total exposure time must include three integration times (one for each color) and two read-out times.

Figure 4:
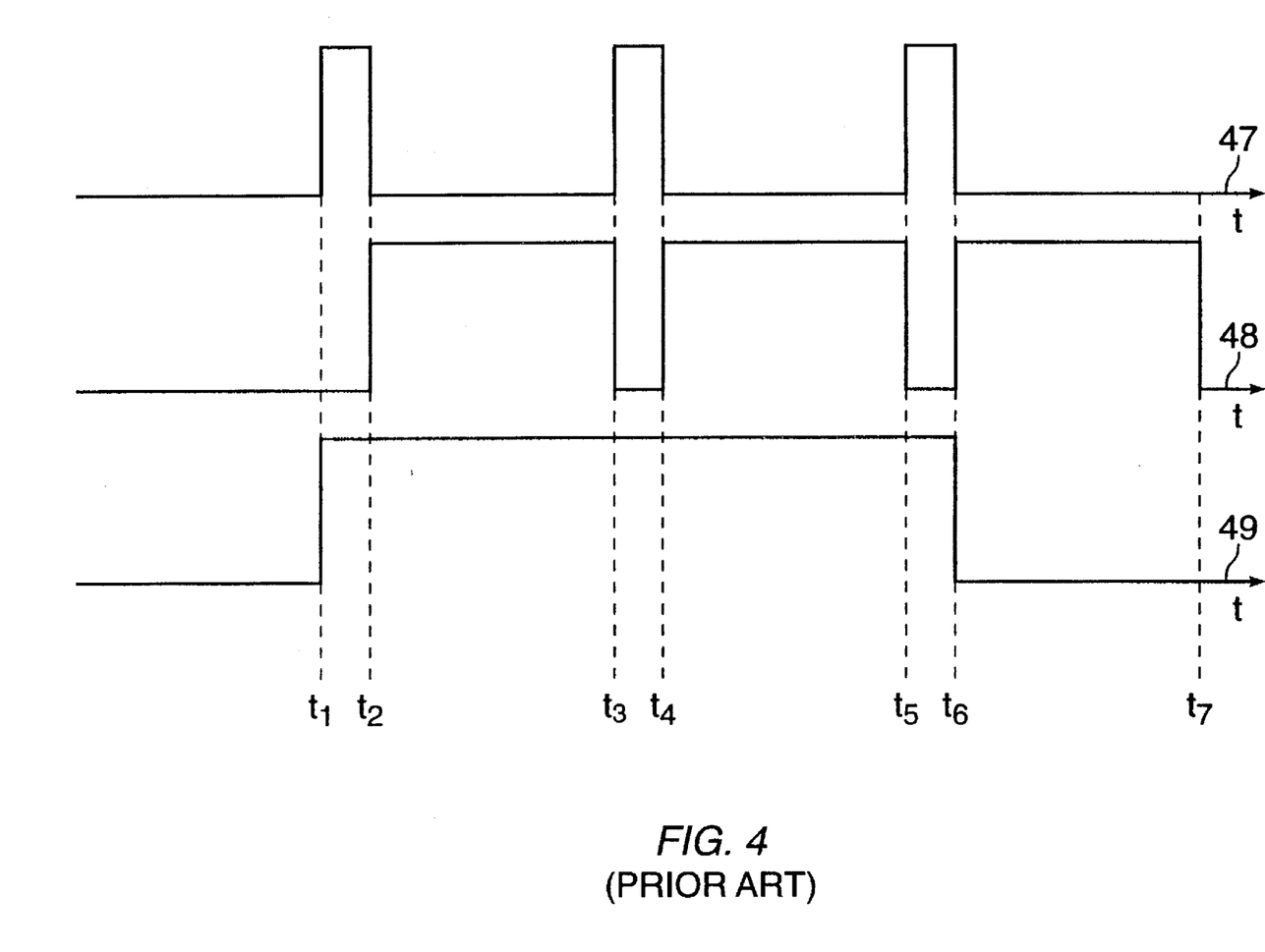
FIG. 4 is a timing diagram for a representative monochrome charge-coupled device imager camera system.

FIG. 4 shows a timing diagram which is representative of a typical exposure time. The top time line 47 is the integration time line which indicates when the CCD imager is exposed to an image. The middle time line 48 is the read-out time line which indicates when a stored image is being read out. The bottom time line 49 is the total exposure time line which represents the time required to acquire a complete color image.

At $t_1$, the imager is exposed to the blue portion of the image (integration time line 47). The image stored during the exposure is then read out beginning at time $t_2$ (read-out time line 48). After the image is downloaded, the imager is exposed to the red portion of the image at $t_3$. The red portion of the image is then downloaded at time $t_4$. Finally, at $t_5$ the imager is exposed to the green portion of the image which is read out at $t_6$. Thus, as illustrated on the total exposure time line 49, this imaging scheme requires three exposures and two read-out intervals before a complete color image can be obtained. In addition, the high density of pixels and sequential nature of the downloading of imaging information further increases the total exposure time, often taking as long as five to ten seconds for a complete color image to be stored. The result being that this technique is unsuitable for creating images of moving subject matter.

Figure 5:
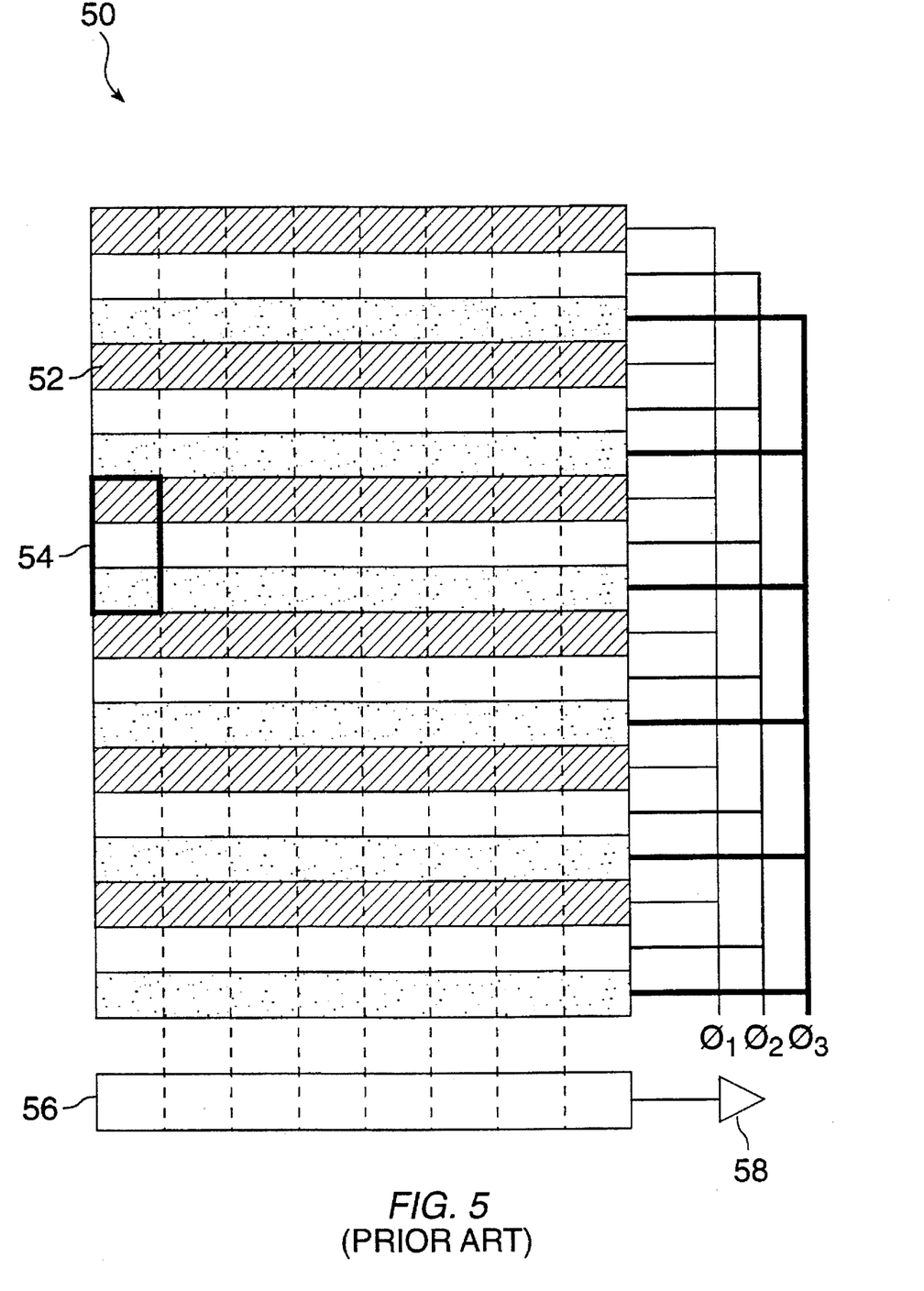
FIG. 5 is a simplified representation of a representative three-phase full frame charge-coupled device imager.

FIG. 5 shows a simplified representation of a conventional three-phase full frame CCD imager 50 which can be used with any of the above-described techniques. Three gate electrodes 52 of each individual semiconductor storage cell 54 (one such cell shown outlined in bold lines) are controlled by one set of clock signals $\phi_1$, $\phi_2$, and $\phi_3$. Charge which is stored in each row of cells is shifted into a horizontal CCD register 56 from which it can be read out serially through output 58.

In light of the preceding discussion, it is apparent that there exists a need for a full frame, color CCD imager which combines the low cost of sequential color illumination with the speed of costly white light illumination schemes.

SUMMARY OF THE INVENTION

According to the invention, a technique and structure is provided for producing high resolution color images using a monochrome charge-coupled device (CCD) imager and a sequential color illumination scheme. The monochrome CCD imager comprises a plurality of semiconductor storage cells, the semiconductor storage cells being configured in an array having vertical columns and horizontal rows. Each vertical column comprises a CCD register that is isolated from adjacent columns by potential barriers. Each semiconductor storage cell, or pixel, has at least one gate electrode which controls the potential profile of the cell.

The invention uses a plurality of sets of clocks, each of which controls a portion of the horizontal rows of pixels. The gate electrodes of the pixels in a particular horizontal row are all connected to a single set of clocks. The horizontal rows controlled by one set of clocks are separated from others controlled by the same set of clocks by intervening rows which are controlled by other sets of clocks.

The procedure by which an image is stored will be described with reference to an embodiment of the invention in which three sets of clocks are employed, and each pixel has three gate electrodes. This is by no means the only configuration by which the invention may be implemented. To begin the procedure, the entire monochrome CCD imager is exposed to a first color image. The charge packets stored in the first and second sets of horizontal rows as a result of the exposure are then shifted into the third set of horizontal rows of pixels. The entire CCD imager is again exposed to a second color image. The charge packets stored in the first set of horizontal rows are then shifted into the second set of horizontal rows. The CCD imager is then exposed to a third and final color image.

To download the stored image, all of the vertical gate electrodes are clocked and shifted and all of the charge packets stored in each horizontal row are clocked into a horizontal register and then read out sequentially. The CCD imager output is digitized and stored in a frame. The color information of a particular location on the CCD array is derived by utilizing a simple set of equations described below.

Thus, the invention comprises an apparatus and method for producing color images using a monochrome charge-coupled device, the monochrome charge-coupled device comprising a plurality of semiconductor storage cells being controlled by gate electrodes, the semiconductor storage cells being configured in an array comprising vertical columns and horizontal rows. The method comprises the steps of: exposing the monochrome charge-coupled device to a first color portion of an image; moving charge packets stored in a first set of horizontal rows of semiconductor storage cells into a second set of horizontal rows of semiconductor storage cells; repeating said exposing and moving steps where the number of color portions of the image to which the charge-coupled device is exposed exceeds two, the steps to be repeated for each exposure in excess of two; exposing the monochrome charge-coupled device to a final color portion of the image; downloading final charge packets stored in each horizontal row of semiconductor storage cells into a horizontal charge-coupled device register, the horizontal charge-coupled device register storing the final charge packets from one horizontal row of semiconductor storage cells at a time; serially outputting from the horizontal charge-coupled device register the final charge packets from each horizontal row of semiconductor storage cells; storing digital information corresponding to the final charge packets; and processing the digital information to derive color information corresponding to locations on the monochrome charge-coupled device.

BRIEF DESCRIPTION OF THE DRAWINGS

FIG. 8a–l are stylized illustrations of the potential profile of a portion of a vertical CCD column constructed in accordance with a preferred embodiment of the invention at various times during the imaging process.

DESCRIPTION OF THE SPECIFIC EMBODIMENTS

Figure 6A:
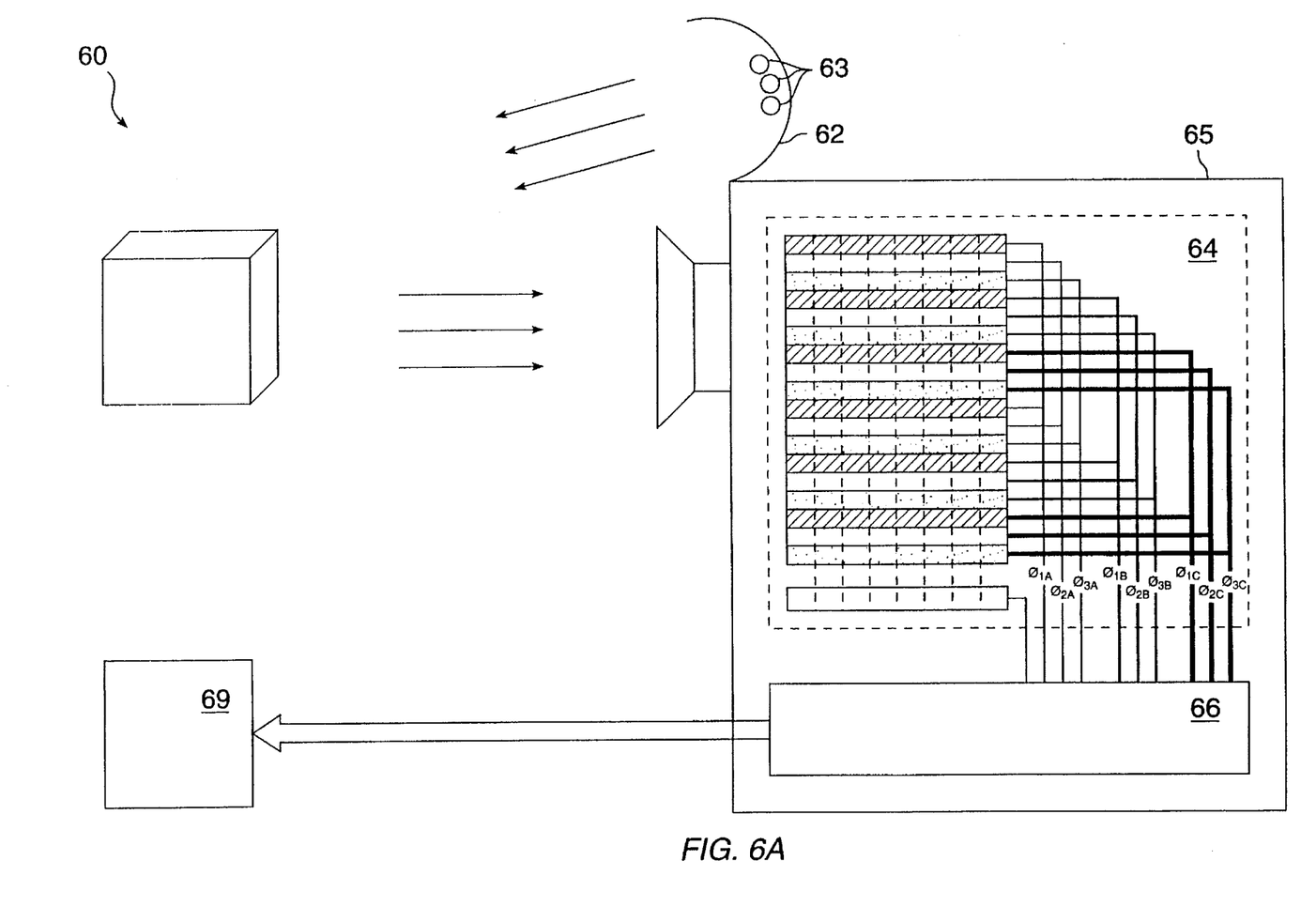
FIG. 6a is a block diagram of one embodiment of a photographic imaging system designed in accordance with the invention.
Figure 6B:
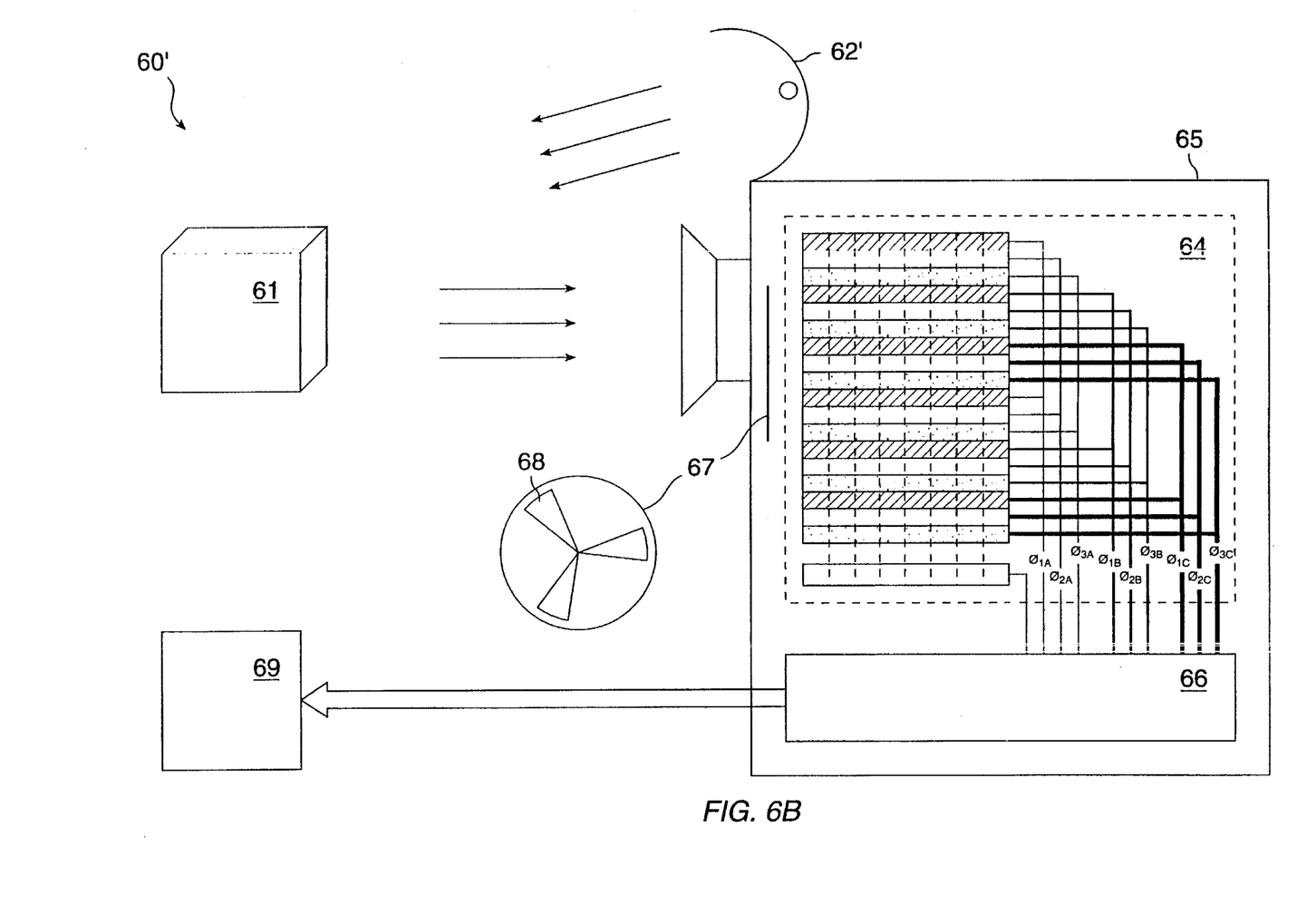
FIG. 6b is a block diagram of a second embodiment of a photographic imaging system designed in accordance with the invention.

FIG. 6a and 6b are block diagrams of a two preferred embodiments of a photographic imaging system, 60 and 60'.

In FIG. 6a, an illumination source 62 illuminates the subject matter 61, and thereby, the photosensitive surface of the CCD imager 64 contained in camera 65. This embodiment of the invention employs three strobe lights 63 to implement the illumination source 62. Each of the strobe lights 63 is equipped with a different color filter. To avoid image distortion such as color shadows, it is generally important to ensure that the three strobe lights 63 illuminate the scene from substantially the same angle. This may be accomplished by placing the strobe lights 63 as close together as possible, or by using a coaxial beam-splitter arrangement. The use of diffusers may also reduce the potential problem of color shadows.

Another embodiment of the invention, shown in FIG. 6b, employs a "color focal plane" shutter 67 in front of the monochrome CCD imager 64. The "color focal plane" shutter 67 is similar to conventional focal plane shutters. The shutter comprises three aperture slits 68 moving rapidly across the focal plane, thereby filtering the light from the white light illumination source 62'.

The imager 64 is controlled by a microcomputer 66 which manipulates the clock signals $\phi$, and which may perform any of the following functions: downloading the stored image; storing the image; processing the image; outputting the image to a display means 69 which may comprise, for example, a color printer or a video monitor; and controlling the strober 62 or shutter 67.

Figure 7:
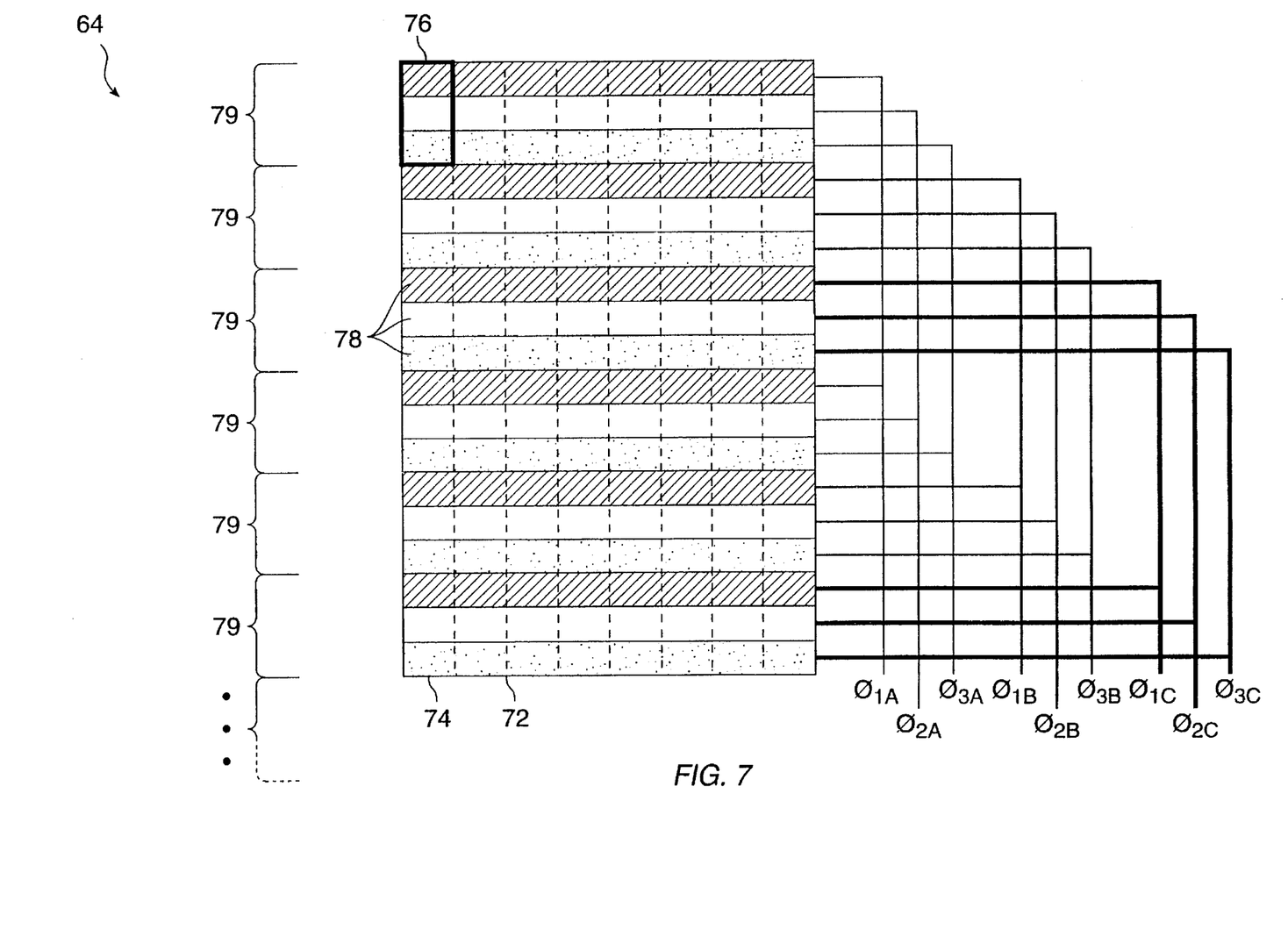
FIG. 7 is a simplified representation of a preferred embodiment of a full frame charge-coupled device imager designed in accordance with the invention.

FIG. 7 illustrates a portion of a monochrome CCD imager 64 constructed in accordance with the invention. Each column 74 (separated by potential barriers 72) represents a CCD register comprising a plurality of photosensitive semiconductor storage cells 76 (one such cell is outlined in bold lines). Each cell has three polysilicon gate electrodes 78 by which the cell's potential profile may be controlled using clock signals $\phi$. Each horizontal row 79 of cells 76 is controlled by one set of clocks out of three sets of clocks (e.g., Row 1 is controlled by a set of clocks $\phi_{nA}$, with n=1, 2, and 3), with each set of clocks controlling every third row as shown. Each set of clock signals is distinct from the other two sets of clock signals.

A preferred architecture for a very high resolution full frame CCD imager is defined as follows:

CCD imager active area size: 2¼"×2¼" (60 mm×60 mm) (i.e., compatible with the large negative format of very high resolution photography equipment, such as in cameras made by Hasselblad)

Pixel size: 10 µm (vertical)×30 µm (horizontal)

Pixel count: 6000 (vertical)×2000 (horizontal)

Horizontal CCD register: 2000 pixels

"Color Pixel" size: 30 µm×30 µm (3 monochrome pixels)

"Color Pixel" resolution: 2000 pixels×2000 pixels

Figures 8, 8A, 8B, 8C, 8D:
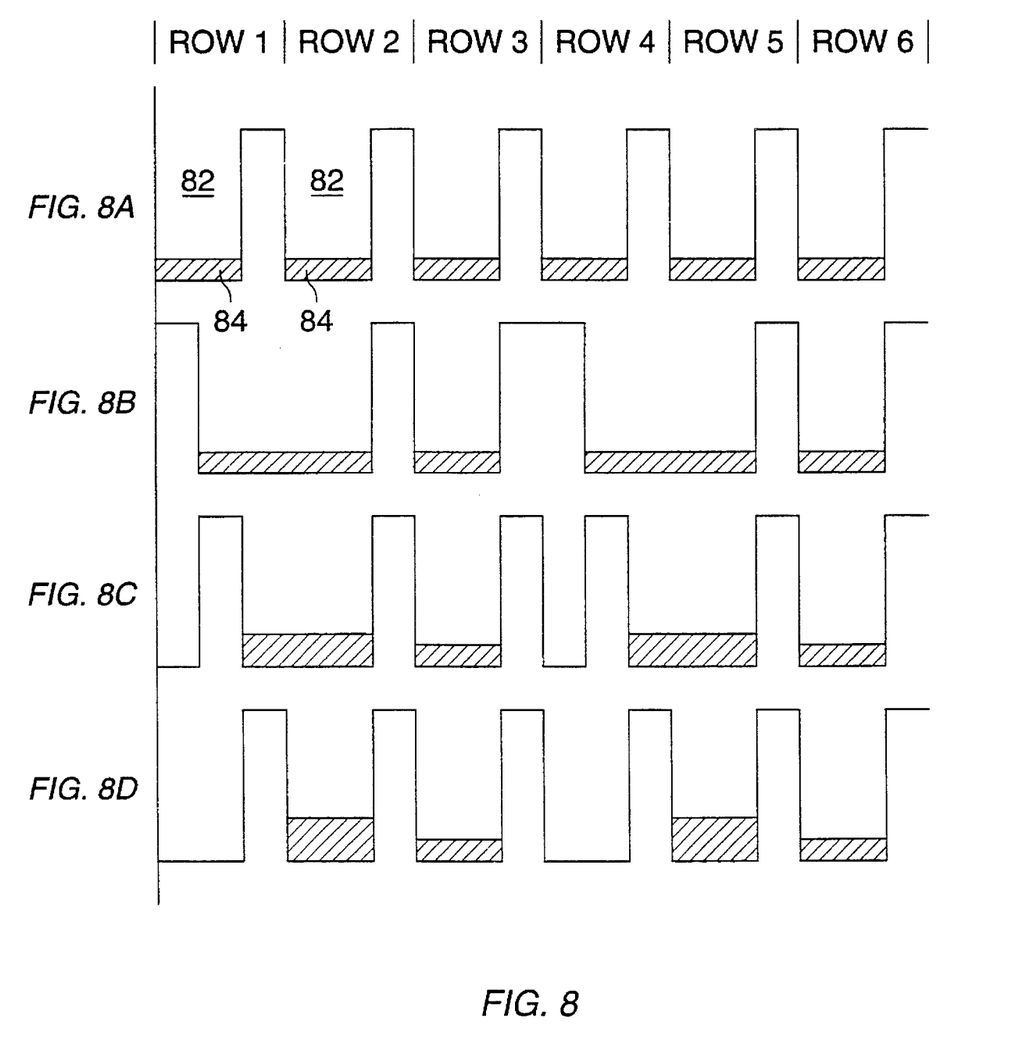

In the preferred embodiment, the entire CCD imager is exposed initially to the blue portion of the image. Blue is the preferred first color exposure because the blue portion of an image has the lowest energy. FIGS. 8a through 8l are idealized representations of potential profiles of a portion of one CCD column at various stages during the acquisition of an image. At time $t_0$, immediately following the blue exposure, the CCD column is in the state shown in FIG. 8a. The "wells" 82 in which charge packets 84 (designated by cross-hatched and shaded areas) are deposited by the exposure are potential wells created by bias voltages on the clock lines $\phi$. The profile shown in FIG. 8a is created by the following state: $\phi_{1A}$, $\phi_{1B}$, $\phi_{1C}$, $\phi_{2A}$, $\phi_{2B}$, and $\phi_{2C}$ are held high, and $\phi_{3A}$, $\phi_{3B}$, and $\phi_{3C}$ are held low. At $t_1$, the voltage on $\phi_{1A}$ is brought low while the voltage on $\phi_{3A}$ is brought high. This alters the potential profile of the CCD column as shown in FIG. 8b. At $t_2$, the voltage on $\phi_{1A}$ is brought high again while the voltage on $\phi_{2A}$ is brought low. This alters the potential profile of the CCD column as shown in FIG. 8c. At $t_3$, the voltage on $\phi_{2A}$ is brought high again while the voltage on $\phi_{3A}$ is brought back low. This alters the potential profile of the CCD column as shown in FIG. 8d. At this point, the charge packets 84 are stored, for example, in rows 2, 3, 5, and 6, leaving rows 1 and 4 empty.

Figures 8E, 8F:
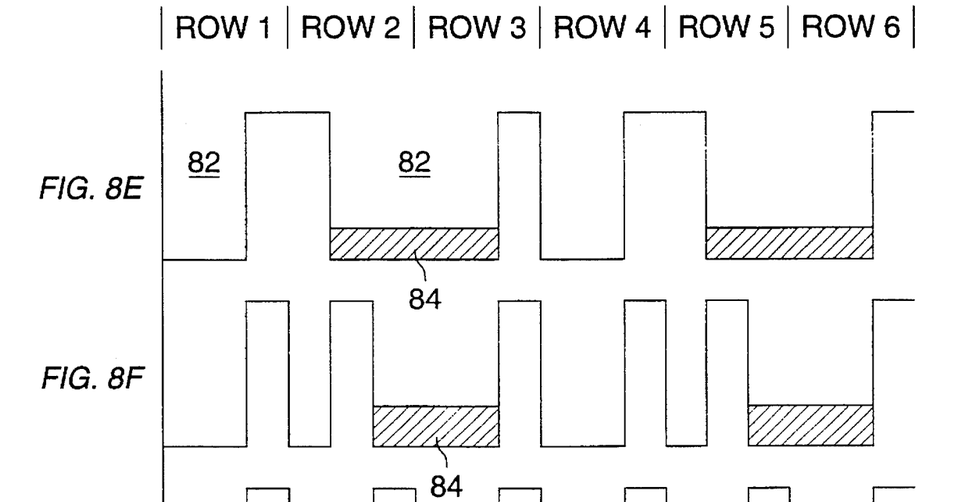
Figure 8G:
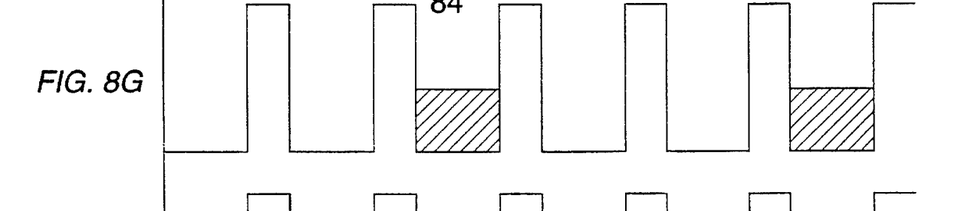

At $t_4$, the voltage on $\phi_{1B}$ is brought low while the voltage on $\phi_{3B}$ is brought high. This alters the potential profile of the CCD column as shown in FIG. 8e. At $t_5$, the voltage on $\phi_{1B}$ is brought back high while the voltage on $\phi_{2B}$ is brought low. This alters the potential profile of the CCD column as shown in FIG. 8f. Finally, at $t_6$, the voltage on $\phi_{2B}$ is brought back high while the voltage on $\phi_{3B}$ is brought low again. This alters the potential profile of the CCD column as shown in FIG. 8g. Thus, for example, the entire blue portion of the image is shifted from rows 1 and 2 into row 3, and from rows 4 and 5 into row 6, leaving rows 1, 2, 4 and 5 empty. This shifting of charge packets 84 occurs in a similar manner across the CCD array.

Figure 8H:
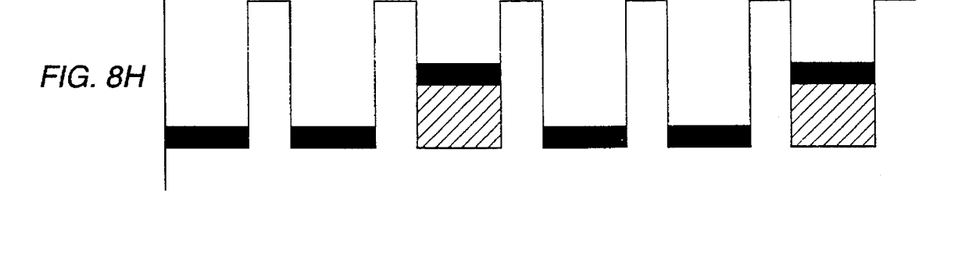
Figure 8I:
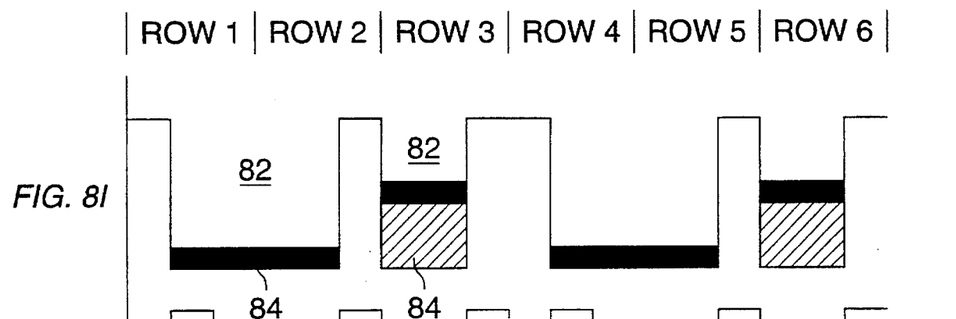
Figure 8J:
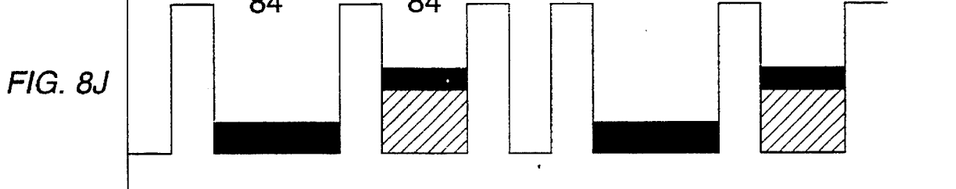
Figure 8K:
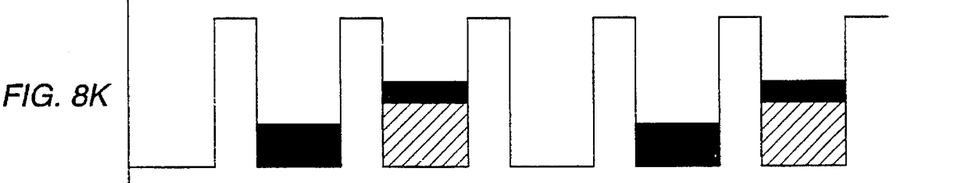

At $t_7$, immediately after the CCD imager is exposed to the red portion of the image, the state of the clocks lines is again as follows: $\phi_{1A}$, $\phi_{1B}$, $\phi_{1C}$, $\phi_{2A}$, $\phi_{2B}$, and $\phi_{2C}$ are held high, and $\phi_{3A}$, $\phi_{3B}$, and $\phi_{3C}$ are held low. The charge packets 84 are distributed as shown in FIG. 8h, with the cross-hatched regions representing charge from the blue exposure, and the shaded regions representing charge from the red exposure. At $t_8$, the voltage on $\phi_{3A}$ is brought high while the voltage on $\phi_{1A}$ is brought low. This alters the potential profile of the CCD column as shown in FIG. 8i. At $t_9$, the voltage on $\phi_{1A}$ is brought back high while the voltage on $\phi_{2A}$ is brought low. This alters the potential profile of the CCD column as shown in FIG. 8j. At $t_{10}$, the voltage on $\phi_{2A}$ is brought back high while the voltage on $\phi_{3A}$ is again brought low. This alters the potential profile of the CCD column as shown in FIG. 8k. Thus, the red portion of the image is moved, for example, from row 1 into row 2 and from row 4 into row 5. A portion of the red image remains in rows 3 and 6 undisturbed. Rows 1 and 4 are again left empty.

Figure 8L:
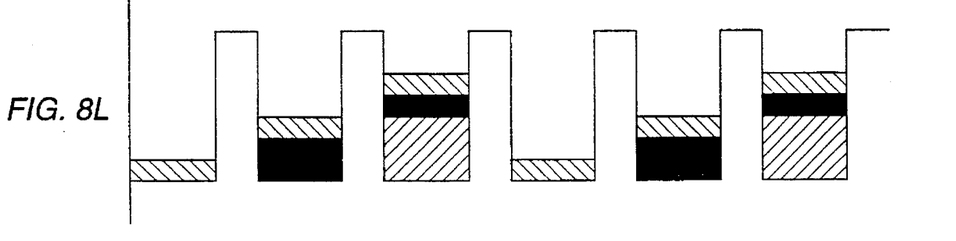

Finally, the entire imager is exposed to the green portion of the image, a portion of which is stored in all of the rows at $t_{11}$ (FIG. 8l).

If one assumes that the light level on three adjacent rows is approximately the same, the technique described above will result in the following approximate charge distribution in the adjacent pixels. Rows 3, 6, and 9 will contain the entire blue portion of the image, ⅓ of the red portion, and ⅓ of the green portion. Rows 2, 5, and 8 will contain ⅔ of the red portion, and ⅓ of the green portion. Rows 1, 4, and 7 will contain only ⅓ of the green portion of the image.

In order for the assumption described above to be valid, the optics of the CCD imager is, in some embodiments, designed to ensure that the imager is incapable of resolving images below a certain critical level. To achieve this result, each pixel is equipped with a plate of birefringent material, such as calcite, which acts to "smear" the incident image, thus acting as a resolution limit.

After exposure to the desired image is complete, the stored charge is downloaded in the following manner. All of the gate electrodes are clocked in a repeating three-phase sequence (the gate electrodes in each horizontal row being clocked simultaneously) and the charge packets stored in each horizontal row are shifted down the array and placed in a horizontal CCD register. Each row is then clocked out sequentially. The output is then digitized and stored in a frame memory for later display or printing.

When deriving an image from the frame memory for displaying or printing, the red, green, and blue color information of a particular "color pixel" is derived. In a preferred embodiment, a color pixel in a derived image corresponds to three vertically adjacent monochrome pixels in the CCD imager. Thus, for example, a color pixel would comprise 3 monochrome pixels from Rows A, B, and C, where Rows A, B, and C are derived according to the following discussion.

The pixels of rows 1, 4, and 7 contain only green information. Therefore, because of the simplifying approximation outlined above, the full value for the green rows can be obtained by multiplying the values stored in rows 1, 4, and 7 by three. This may be represented by the following equations:

Row A=Row 1*3

Row D=Row 4*3

Row G=Row 7*3

Rows A, D, and G corresponding to rows of green pixels in the displayed or printed image.

The pixels of rows 2, 5, and 8 contain both red and green information. Again because of the simplifying assumption, the full value of the red rows can be obtained by subtracting the value stored for rows 1, 4, and 7 from the value stored in rows 2, 5, and 8 and multiplying the result by 3/2. This is represented by the following equations:

Row B=3/2*(Row 2–Row 1)

Row E=3/2*(Row 5–Row 4)

Row H=3/2*(Row 8–Row 7)

Rows B, E, and H corresponding to rows of red pixels in the displayed or printed image.

Finally, the full value of the blue rows can be obtained by adding the value of rows 1, 4, and 7 to the value of rows 2, 5, and 8, dividing the resulting value by 2 and subtracting that number from the value stored in rows 3, 6, and 9. This is represented by the following equations:

Row C=Row 3–½(Row 1+Row 2)

Row F=Row 6–½(Row 4+Row 5)

Row I=Row 9–½(Row 7+Row 8)

Rows C, F, and I corresponding to rows of blue pixels in the displayed or printed image.

An alternate means of processing the stored information to derive the rows of blue pixels is represented by the following equations:

Row C=Row 3–¼(Row 1+Row 2+Row 4+Row 5)

Row F=Row 6–¼(Row 4+Row 5+Row 7+Row 8)

Row I=Row 9–¼(Row 7+Row 8+Row 10+Row 11)

This alternate processing method more accurately derives the blue portion of an image when the simplifying assumption outlined above lacks validity as may sometimes be the case. These equations, in effect, average the values stored in the rows above and below the row to be derived rather than only allowing the rows above the row to be derived to contribute to the final image. In still further embodiments, nearest or near neighbor analysis will further enhance the accuracy of the image.

While the invention has been particularly shown and described with reference to specific embodiments thereof, it will be understood by those skilled in the art that the foregoing and other changes in the form and details may be made therein without departing from the spirit or scope of the invention. Specifically, while the embodiment described above employs a three-phase CCD imager, it will be evident to those skilled in the art that the invention may be implemented using a number of different schemes. For example, if permanent barriers are implanted between adjacent cells, it is possible to achieve the desired shifting functions with fewer than three gate electrodes on each cell. Further, the number of sets of clock signals may vary with the number of colors desired to be stored. Consequently, the scope of the invention should be determined solely with respect to the following claims.

What is claimed is:

1. A method for producing images using a monochrome charge-coupled device, the monochrome charge-coupled device comprising a plurality of photosensitive semiconductor storage cells being controlled by gate electrodes, the photosensitive semiconductor storage cells being configured in an array comprising vertical columns and horizontal rows, the method comprising the steps of:

exposing the monochrome charge-coupled device to a portion of an image, thereby generating charge packets in the array of photosensitive semiconductor storage cells;

moving said charge packets stored in a first set of horizontal rows of photosensitive semiconductor storage cells into a second set of horizontal rows of photosensitive semiconductor storage cells, said charge packets remaining in the array of photosensitive semiconductor storage cells for subsequent exposures;

where the total number of portions of the image to which the charge-coupled device is exposed exceeds two, repeating said exposing and moving steps for each exposure in excess of two, charge packets from each successive exposure being combined in the array of photosensitive semiconductor storage cells in a predetermined manner with charge packets from previous exposures; and exposing the monochrome charge-coupled device to a final portion of the image, thereby generating final charge packets in the array of photosensitive semiconductor storage cells, selected ones of the final charge packets comprising charge from more than one horizontal row and from more than one exposure stored in a single horizontal row.

2. A method as described in claim 1 wherein the exposing steps are accomplished by means of strobe lights, each of the strobe lights being equipped with a color filter.

3. A method as described in claim 1 wherein the exposing steps are accomplished by means of white light illumination of a shutter interposed between the white light source and the array of photosensitive semiconductor storage cells, the shutter having a plurality of apertures with color filters, the apertures moving sequentially across the array of photosensitive semiconductor storage cells.

4. A method as described in claim 1 wherein each moving step comprises selectively applying clock signals to the gate electrodes to move charge packets from a first horizontal row of photosensitive semiconductor storage cells to a second horizontal row of photosensitive semiconductor storage cells, the second row of photosensitive semiconductor storage cells being vertically adjacent the first row of photosensitive semiconductor storage cells.

5. A method as described in claim 25 wherein the downloading step comprises applying clock signals to the gate electrodes in a repeating multi-phase sequence to shift the final charge packets stored in the photosensitive semiconductor storage cells into the horizontal charge-coupled device register.

6. A method for producing images using a monochrome charge-coupled device, the monochrome charge-coupled device comprising a plurality of photosensitive semiconductor storage cells being controlled by gate electrodes, the photosensitive semiconductor storage cells being configured in an array comprising vertical columns and horizontal rows, the method comprising the steps of:

exposing the monochrome charge-coupled device to a first portion of an image, thereby generating first charge packets in the array of photosensitive semiconductor storage cells;

moving said first charge packets stored in a first set of horizontal rows of photosensitive semiconductor storage cells into a second set of horizontal rows of photosensitive semiconductor storage cells, said first charge packets remaining in the array of photosensitive semiconductor storage cells for subsequent exposures;

exposing the monochrome charge-coupled device to a second portion of the image, thereby generating second charge packets in the array;

moving said second charge packets stored in a third set of horizontal rows of photosensitive semiconductor storage cells into a fourth set of horizontal rows of photosensitive semiconductor storage cells, said second charge packets remaining in the array of photosensitive semiconductor storage cells for subsequent exposures, said second charge packets being combined in the array of photosensitive semiconductor storage cells in a predetermined manner with said first charge packets; and exposing the monochrome charge-coupled device to a third portion of the image, thereby generating third charge packets in the array of photosensitive semiconductor storage cells, selected ones of the third charge packets comprising charge from more than one horizontal row and from more than one exposure stored in a single horizontal row.

7. A method as described in claim 6 wherein the first, second, and third portions of the image comprise monochromatic color portions of the image.

8. A method as described in claim 6 wherein the exposing steps are accomplished by means of three strobe lights, each of the strobe lights being equipped with a color filter.

9. A method as described in claim 6 wherein the exposing steps are accomplished by means of white light illumination of a shutter interposed between the white light source and the array of photosensitive semiconductor storage cells, the shutter having three apertures with color filters, the apertures moving sequentially across the array of photosensitive semiconductor storage cells.

10. A method as described in claim 6 wherein the moving steps comprise selectively applying clock signals to the gate electrodes to move the first and second charge packets from a first horizontal row of photosensitive semiconductor storage cells to a second horizontal row of photosensitive semiconductor storage cells, the second row of photosensitive semiconductor storage cells being vertically adjacent the first row of photosensitive semiconductor storage cells.

11. A method as described in claim 26 wherein the downloading step comprises applying clock signals to the gate electrodes in a repeating three-phase sequence to shift the third charge packets stored in the photosensitive semiconductor storage cells into the horizontal charge-coupled device register.

12. A monochrome charge-coupled device, comprising:
a plurality of photosensitive semiconductor storage cells configured in an array having vertical columns and horizontal rows, each photosensitive semiconductor storage cell having a potential profile;
a plurality of gate electrodes coupled to the plurality of photosensitive semiconductor storage cells for controlling the potential profiles of the photosensitive semiconductor storage cells; and
a plurality of independently controllable clock lines coupled to the plurality of gate electrodes for supplying clocking signals to the gate electrodes, the clock lines comprising a plurality of mutually exclusive sets of clock lines, each set of clock lines for controlling the potential profiles of the photosensitive semiconductor storage cells in a subset of the horizontal rows, each of every three adjacent horizontal rows being controlled by a different one of the sets of clock lines.

13. A monochrome charge-coupled device as described in claim 12 wherein there are three gate electrodes coupled to each photosensitive semiconductor storage cell, and there are three sets of clock lines.

14. A monochrome charge-coupled device as described in claim 12 further comprising a birefringent material, each semiconductor storage cell being covered by the birefringent material.

15. A monochrome charge-coupled device as described in claim 14 wherein the birefringent material comprises calcite.

16. A monochrome charge-coupled device as described in claim 12 wherein each vertical column of photosensitive semiconductor storage cells comprises 6000 monochrome pixels, and each horizontal row of photosensitive semiconductor storage cells comprises 2000 monochrome pixels, each pixel having a horizontally measured width and a vertically measured height, the width of each pixel being 30 µm, and the height of each pixel being 10 µm.

17. A monochrome charge-coupled device for producing color images using a sequential color illumination scheme, the monochrome charge-coupled device comprising:
a plurality of photosensitive semiconductor storage cells, the photosensitive semiconductor storage cells being configured in an array having vertical columns and horizontal rows;
a plurality of gate electrodes, each photosensitive semiconductor storage cell comprising three gate electrodes, the gate electrodes controlling vertical potential profiles of the photosensitive semiconductor storage cells;
a first set of clock lines, the first set of clock lines conducting a first set of clock signals, the first set of clock signals comprising three distinct clock signals, and being connected to the gate electrodes of the photosensitive semiconductor storage cells in a first set of horizontal rows;
a second set of clock lines, the second set of clock lines conducting a second set of clock signals, the second set of clock signals comprising three distinct clock signals, and being connected to the gate electrodes of the photosensitive semiconductor storage cells in a second set of horizontal rows; and
a third set of clock lines, the third set of clock lines conducting a third set of clock signals, the third set of clock signals comprising three distinct clock signals, and being connected to the gate electrodes of the photosensitive semiconductor storage cells in a third set of horizontal rows;
wherein each of every three adjacent horizontal rows is coupled to and controlled by a different one of the first, second, and third sets of clock lines.

18. A camera for producing color images comprising:
a microcomputer for controlling the operation of the camera;
a monochrome charge-coupled device further comprising:
a plurality of photosensitive semiconductor storage cells, the photosensitive semiconductor storage cells being configured in an array having vertical columns and horizontal rows;
a plurality of gate electrodes, each semiconductor storage cell comprising three gate electrodes, the gate electrodes controlling vertical potential profiles of the photosensitive semiconductor storage cells;
a first set of clock lines, the first set of clock lines conducting a first set of clock signals, the first set of clock signals comprising three distinct clock signals, and being connected to the gate electrodes of the photosensitive semiconductor storage cells in a first set of horizontal rows;
a second set of clock lines, the second set of clock lines conducting a second set of clock signals, the second set of clock signals comprising three distinct clock signals, and being connected to the gate electrodes of the photosensitive semiconductor storage cells in a second set of horizontal rows;
a third set of clock lines, the third set of clock lines conducting a third set of clock signals, the third set of clock signals comprising three distinct clock signals, and being connected to the gate electrodes of the photosensitive semiconductor storage cells in a third set of horizontal rows;
wherein each of every three adjacent horizontal rows is coupled to and controlled by a different one of the first, second, and third sets of clock lines; and
an illumination means;
an exposure means for sequentially exposing the charge-coupled device to a plurality of color portions of an image; and
a horizontal charge-coupled device register for downloading stored image information from the array of photosensitive semiconductor storage cells.

19. A camera as described in claim 18 wherein the illumination means comprises three strobe lights, each of the strobe lights being equipped with a color filter.

20. A camera as described in claim 18 wherein the illumination means comprises a white light source.

21. A camera as described in claim 20 wherein the exposure means comprises a shutter interposed between the white light source and the array of photosensitive semiconductor storage cells, the shutter having three apertures with color filters, the apertures moving sequentially across the array of photosensitive semiconductor storage cells.

22. A camera as described in claim 18 further comprising a birefringent material, each semiconductor storage cell being covered by the birefringent material.

23. A method as described in claim 1, further comprising the steps of:
downloading the final charge packets into a horizontal charge-coupled device register, the horizontal charge-coupled device register storing the final charge packets from one horizontal row of photosensitive semiconductor storage cells at a time;

serially outputting from the horizontal charge-coupled device register the final charge packets from each horizontal row of photosensitive semiconductor storage cells;

generating digital information corresponding to the final charge packets;

storing the digital information; and processing the digital information to derive color pixel information corresponding to locations on the monochrome charge-coupled device.

24. A method as described in claim 6, further comprising the steps of:

downloading the third charge packets stored in each horizontal row of photosensitive semiconductor storage cells into a horizontal charge-coupled device register, the horizontal charge-coupled device register storing the third charge packets from one horizontal row of photosensitive semiconductor storage cells at a time;

serially outputting the third charge packets from the horizontal charge-coupled device register;

generating digital information corresponding to the third charge packets;

storing the digital information; and processing the digital information to derive color pixel information corresponding to locations on the monochrome charge-coupled device.

25. A method for producing images using a monochrome charge-coupled device, the monochrome charge-coupled device comprising a plurality of photosensitive storage regions, each photosensitive storage region comprising first and second photosensitive subregions, the method comprising the steps of:

exposing the photosensitive storage regions to electromagnetic energy thereby generating first charge in the first and second subregions of each photosensitive storage region;

moving the first charge in selected photosensitive storage regions from the second subregion into the first subregion;

exposing the photosensitive storage regions to electromagnetic energy thereby generating second charge in the first and second subregions of each photosensitive storage region, the second charge combining with the first charge in the first subregion; and reading out the first and second charge from the photosensitive storage regions.

26. A method for producing multiple images without intervening readout periods using a monochrome charge-coupled device, the monochrome charge-coupled device comprising a plurality of photosensitive semiconductor storage cells being controlled by gate electrodes, the photosensitive semiconductor storage cells being configured in an array comprising vertical columns and horizontal rows, the method comprising the steps of:

exposing the monochrome charge-coupled device to a portion of an image, thereby generating charge packets in the array of photosensitive semiconductor storage cells;

moving said charge packets stored in a first set of horizontal rows of photosensitive semiconductor storage cells into a second set of horizontal rows of photosensitive semiconductor storage cells, said charge packets remaining in the array of photosensitive semiconductor storage cells for subsequent exposures;

where the total number of portions of the image to which the charge-coupled device is exposed exceeds two, repeating said exposing and moving steps for each exposure in excess of two, charge packets from each successive exposure being combined in the array of photosensitive semiconductor storage cells in a predetermined manner with charge packets from previous exposures;

exposing the monochrome charge-coupled device to a final portion of the image, thereby generating final charge packets in the array of photosensitive semiconductor storage cells, selected ones of the final charge packets comprising charge from more than one horizontal row and from more than one exposure stored in a single horizontal row; and processing the final charge packets to determine each of the multiple images.

* * * * *